United States Patent [19]

Bezinque et al.

[11] Patent Number: 4,949,036

[45] Date of Patent: Aug. 14, 1990

[54] DISC DRIVE ERROR MAPPING USING THRESHOLD COMPARISON METHODS

[75] Inventors: David J. Bezinque, Santa Cruz County; Mark R. McCornack, Santa Clara County; Michael E. Hammersley, Santa Cruz County, Calif.

[73] Assignee: Seagate Technology, Inc., Scotts Valley, Calif.

[21] Appl. No.: 216,326

[22] Filed: Jul. 7, 1988

[51] Int. Cl.[5] ...................... G01R 33/12; G11B 27/36
[52] U.S. Cl. ...................... 324/212; 360/31; 369/53
[58] Field of Search ................ 324/210–212, 324/226, 227, 262; 360/31, 137; 365/53, 69

[56] References Cited

U.S. PATENT DOCUMENTS 3,439,343  4/1969  Stahle .................................... 371/21

Primary Examiner—Reinhard J. Eisenzopf
Assistant Examiner—Walter E. Snow
Attorney, Agent, or Firm—Flehr, Hohbach, Test, Albritton & Herbert

[57] ABSTRACT

An apparatus and method for testing a variety of hard disk drives is disclosed. The apparatus includes a computer connected to a control board and an interface board. The interface board is connected to a testing board. The hard disk drive is connected to the control board and testing board. The hard disk is tested by first erasing a track of data bits at full write current in one direction or polarity and second erasing the track at minimal write current in the opposite direction. The track is read and compared to a predetermined threshold and any level exceeding the threshold is considered defective.

32 Claims, 13 Drawing Sheets

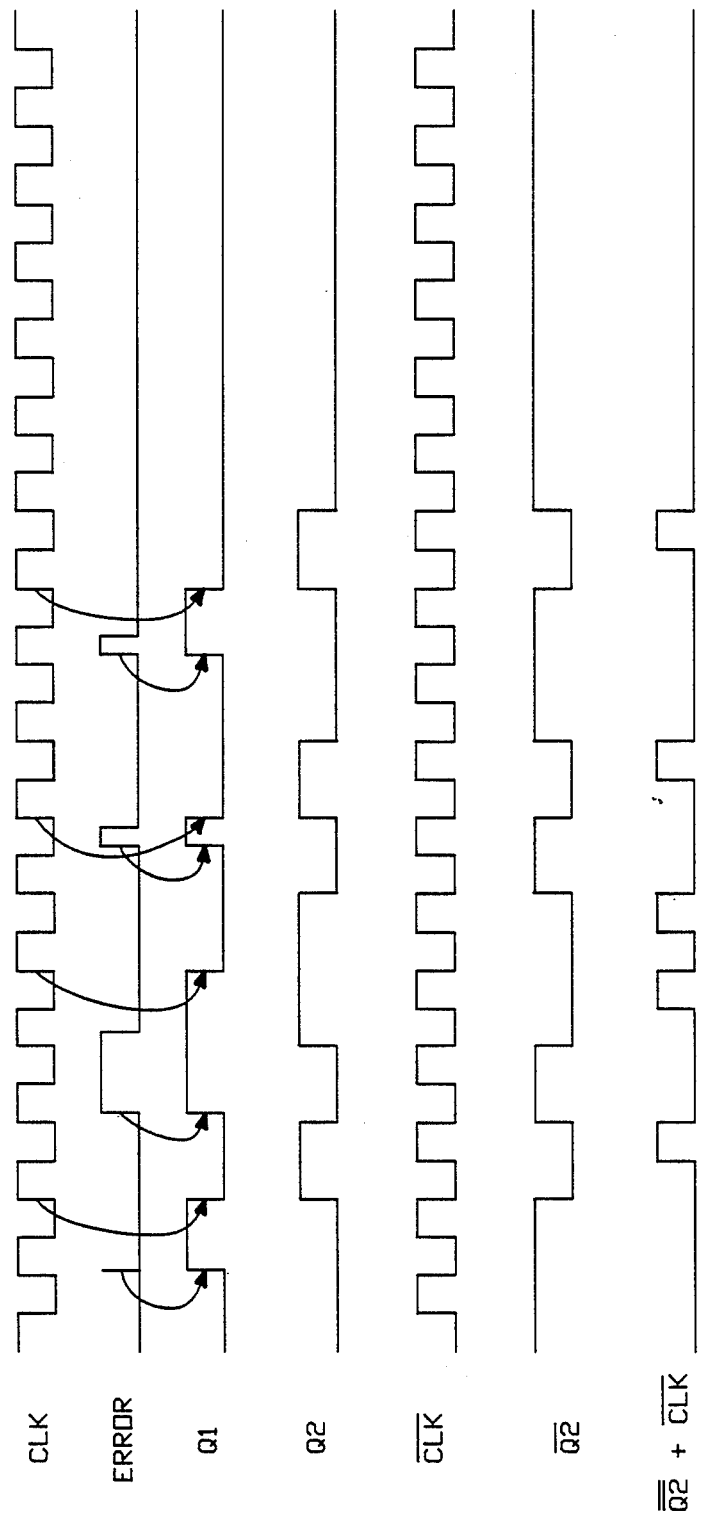

WRITE CONTROL 128

4,949,036

DISC DRIVE ERROR MAPPING USING THRESHOLD COMPARISON METHODS

BACKGROUND OF THE INVENTION

This invention relates generally to mapping disc flaws in hard disc drives. More particularly, the present invention discloses a method by which the time necessary for disc flaw mapping in high capacity disc drives is reduced to an acceptable level.

Before a disc drive can be used, it is necessary to run tests to determine the location of flaws in the disc. Until now, the method of testing was to write a predetermined sequence on the disc at very small intervals. The data is then read off the disc and compared to the initial writing. Any location whose value, when read, did not correspond to the value when written was known to be flawed. This list of locations can then be stored on the disc surface to prevent any attempt to write in the location, and thereby insure customer data integrity.

The major problem with this method of testing disc drives is the large numbers of writes used to find the flaws.

SUMMARY OF THE INVENTION

Therefore, it is a primary objective of this invention to provide a novel method for testing hard disc drives in a short period of time.

Another objective herein is to provide an accurate method for testing hard disc drives which will locate and map even the smallest errors on the disc to insure against loss of data.

A third objective herein is to provide an accurate method for testing disc drives which is also efficient, so that the manufacturer and the consumer may enjoy cost savings.

A fourth objective herein is to provide a method that is accurate, fast and efficient, but which is also easy to operate so that the user may use this invention without having to gain special knowledge in its use.

A fifth objective herein is to provide an analog method of testing because the digital testers presently available are slow and infeasible for use with high capacity drives.

A sixth objective herein is to provide a hard disc drive tester that is easily adaptable to any size drive so that it is not limited to any particular drive.

A seventh objective herein is to make this invention compatible with a variety of computer systems so that it will be accessible to a variety of users.

To achieve the foregoing and other objects of this invention, an analog scan of the media is provided that reports the number, type, and location of all errors found. This invention consists of two tests performed on each track of a target disc drive.

A missing pulse test is first. Here the industry standard code, 2F, is written on each track. Then the read data input signal is set to a predetermined level. Finally, each positive half cycle is compared with a predetermined threshold signal level, and each positive half cycle not exceeding the threshold is considered a missing pulse.

The second test is the extra pulse test. Each track is set to a first level by erasing at full write current in one direction or polarity. Then each track is set to a second level by erasing at minimal write current in the opposite direction or polarity. This technique makes the flaw stand out more than a simple erase at full current. The track is then read and compared to a predetermined threshold signal level and any signal that exceeds this threshold is considered to be an extra pulse.

BRIEF DESCRIPTION OF THE DRAWINGS

The novel features of this invention are set forth with particularity in the appended claims. This invention, together with further objects and advantages, may best be understood by reference to the following description taken in conjunction with the accompanying drawings, wherein:

DETAILED DESCRIPTION OF A PREFERRED EMBODIMENT

Figure 1:
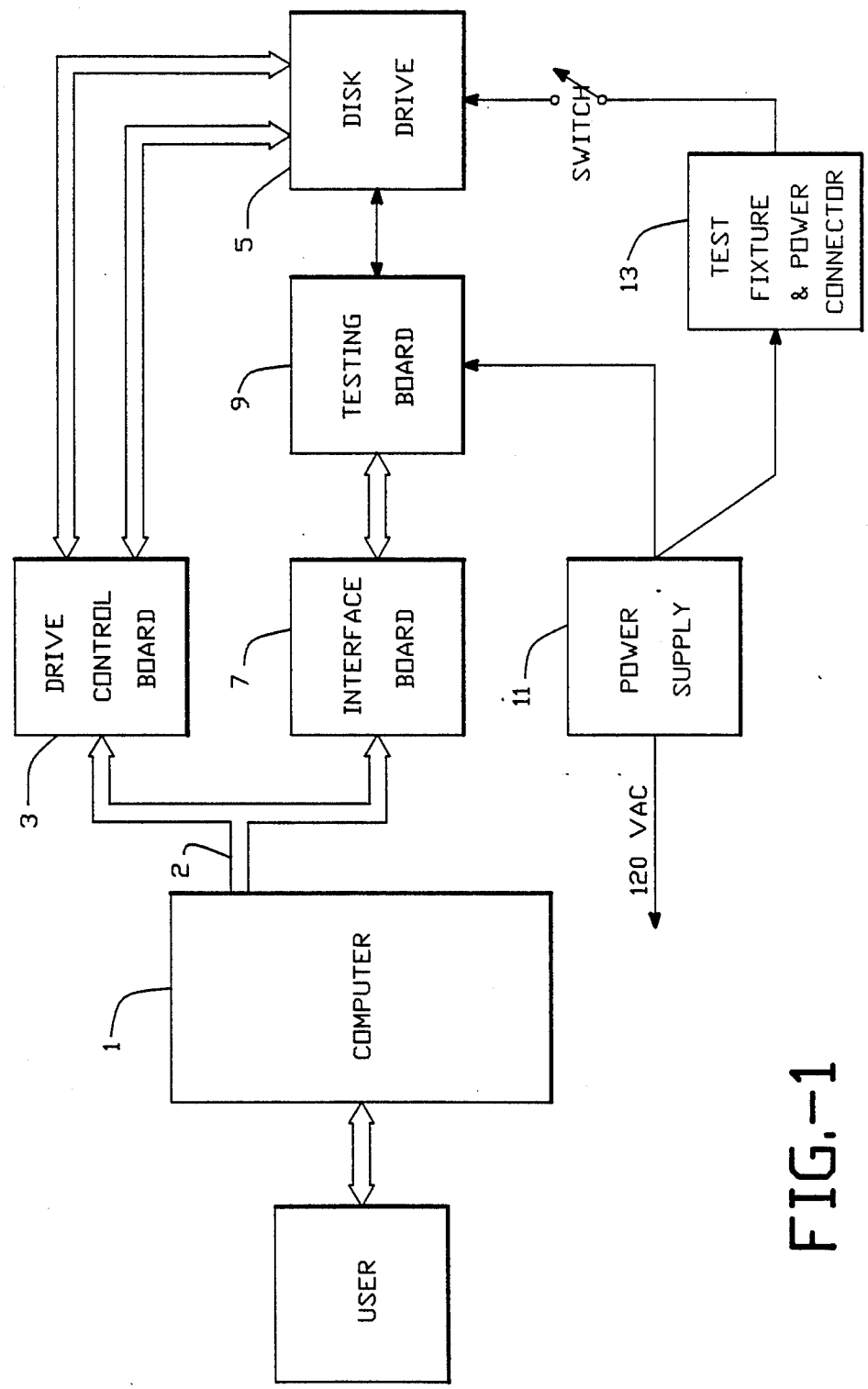
FIG. 1 is a block diagram of the general layout of a defect tester showing the interconnection of several of its key components.

As shown in the drawings, the preferred embodiment of this invention is adapted to reduce the time required to test media storage devices, particularly hard disc drives of high capacity. Referring to FIG. 1, a general layout appears of the micro defect tester in block diagram form. The micro defect tester includes a computer 1 by which the user is able to transmit information to the tester and receive information from the tester. A drive control board 3 is connected to the computer 1 over bus 2. This board issues step and direction commands to move the disc drive actuator from track to track, selects the appropriate read/write head for accessing a desired track, and provides write data to disc drive 5 being tested. An interface board 7 is connected to the computer 1 and to the drive control board 3 as well as an analog board in the test fixture (not shown). Interface 7 especially includes means for measuring time from index to errors read from the disc drive under test. A testing board 9 is connected to the interface board 7 and to the disc drive 5 so that it may provide control signals to the captive board write driver for the disc drive 5, and measure the analog readback signals from the disc in various ways to measure errors. Test board 9 transmits these signals through the interface board 7 back to the computer 1. A power supply 11 provides power to the testing board 9 and to the disc drive 5. Finally, a test fixture 13 interfaces the disc drive 5 to the rest of the defect tester, and provides a quick release mechanism for quickly establishing all connections to the disc drive. It is essentially a mechanical assembly well within the skill of a disc drive test systems person and will not be described here further. It essentially comprises a simple box-like structure having the quick release mechanism for the disc drive head disc assembly (HDA) on top, and the interface control board for that type drive mounted within. The testing board is also mounted within this box so that an integral test assembly is achieved.

Figure 2:
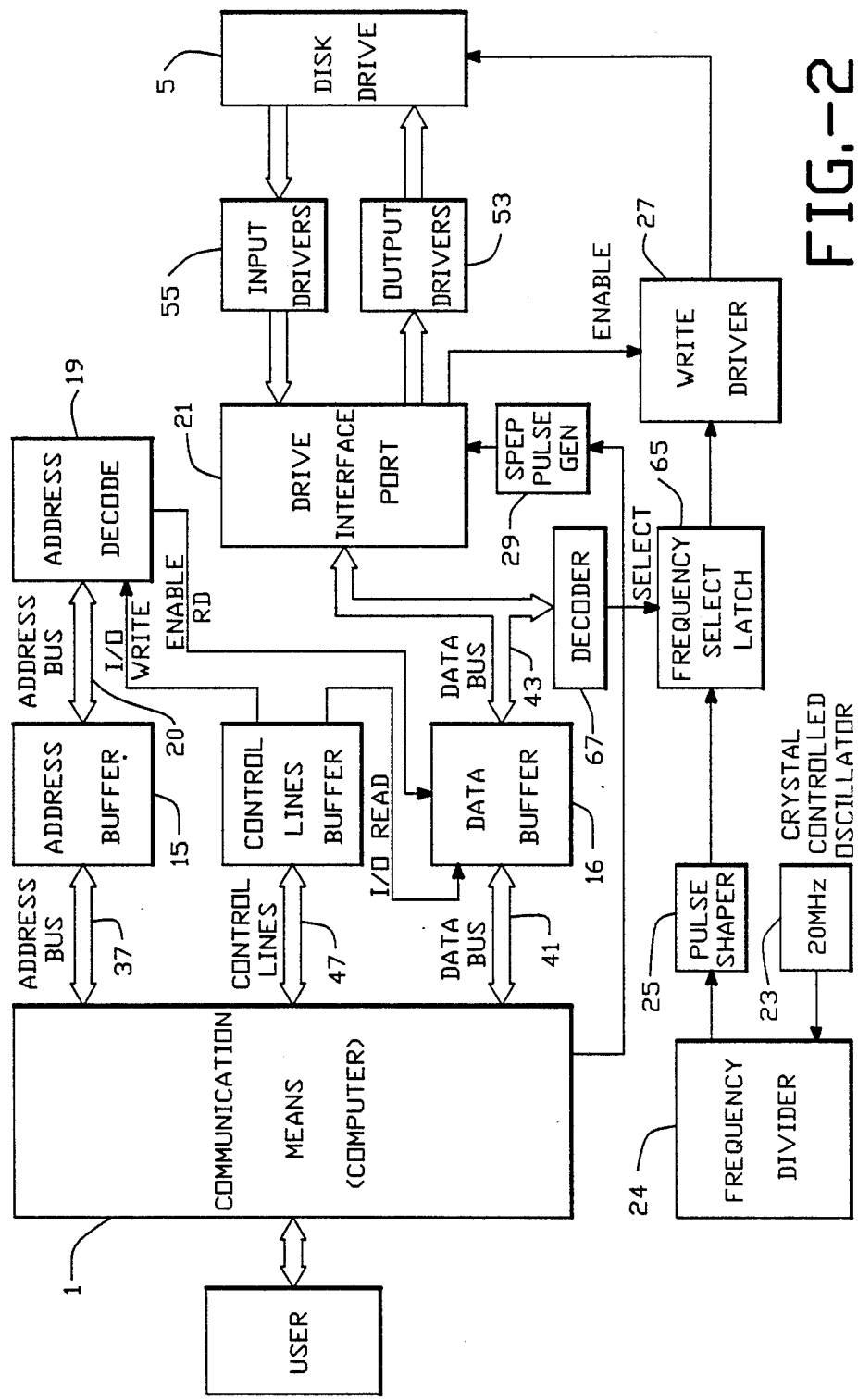
FIG. 2 is a block diagram showing in more detail the drive control board referenced in FIG. 1 and designed in accordance with this invention.

FIG. 2 presents a preferred embodiment of the drive control board 3 referred to in FIG. 1. The drive control board 3 includes an address buffer 15, data buffer 16, and control line buffer 17 for buffering incoming address, data and control lines running to and from the computer 1 over the appropriate buses. An address decoder 19 addressed over an address bus 20 from address buffer 15 enables the data buffer 16 whenever a valid I/O decode signal is issued by the computer 1. Also as a part of the drive control board a drive interface port 21 monitors the status input lines from the disc drive 5. Means are also provided for defining a differential write signal for transmission to the disc drive 5. Finally, a programmable step pulse generator 29 is provided for generating step pulses so that timing can be set up to move the transducer of disc drive 5 being tested to a particular track.

The drive control board 3 illustrated in FIG. 2 works as follows. The address buffer 15 stores an address received on the address bus 37 from the computer 1. The data buffer 16 passes data received on the data bus 41 from the computer 1. The control line buffer 17 passes control line signals received on the control lines 47 from the computer 1. The address decoder 19 enables the data buffer 16 whenever a valid control line signal is issued by the computer 1. When an RD ENABLE signal is received by the data buffer 16, it either transmits data to the host 1 or inputs data from the host 1 depending on the level of the control line signals received from control line buffer 17. When I/O READ is low (true), data output is to the host computer; when I/O RD is high (false), data is input from the host computer 1.

When the data buffer 16 receives data, it passes the data along to the drive interface port 21 on the buffered data bus 43. The drive interface port 21 monitors the status input lines from the disc drive 5 and outputs the control signals to the drive 5. The drive interface port 21 also includes drive interface output drivers 53 and drive interface input receivers 55. More specifically, the drive interface port 21 receives and transmits the drive control and status information via the buffered data bus 41. The drive interface output drivers consist of 7438-type open collector drivers 53 which are able to send the control signals to the disc drive over the connecting ribbon cable 54. The drive interface input receivers 55 consist of terminating resistor pairs, and 74LS14-type Schmitt trigger buffers to buffer the drive interface port 21 from the input signals. The open-collector output drivers 53 are disabled during power-on, and then enabled under software control in utilization of the program after power has been stabilized. The disabling of the drivers 53 prevents spurious steps and/or writes from being transmitted to the drive.

To position the transducer over a specific track for writing and reading test data, the computer 1 issues a step pulse to enable the programmable step pulse generator 29. When the programmable step pulse generator 29 is enabled, it issues step pulses to the drive interface port 21 so that timing may be set up to move the disc drive transducer to a particular track. Data can then be output by the drive interface port 21 to the disc drive 5 via the output drivers 53 as described above.

Data is also received by the drive interface port 21 from the disc drive 5 via the input drivers 55. This data is then sent on the data bus 41 through the data buffer 16 and on to the computer 1.

The write frequency for defining how data shall be written on a specified track is generated by the write oscillator 23. The write oscillator 23, which is preferably a 20 MHz crystal controlled oscillator, feeds this signal into the frequency divider 24 where it is divided by two to produce the 10 MHz system clock. The 1F and 2F frequencies are then derived by dividing the clock frequency. The 1F and 2F signals in turn feed into the pulse shaper 25. From there, the write frequency is presented to the write driver 27. The write frequency for any particular write frequency is selected by the frequency select latch 65. The latch output is then decoded by the decoder 67 which determines the selected frequency from data on the data bus 41. The frequencies available for selection to carry out the processes described herein are all industry standard signals 1F, 2F, DC Erase and External Write Frequency. Write driver 27 receives the selected single-ended write frequency from the frequency select latch 65 and translates it into a differential write signal for transmission to the disc drive 5 to be written on the selected track. The write driver 27 is enabled for this writing step by the write gate signal received from the drive interface port 21.

Figure 3:
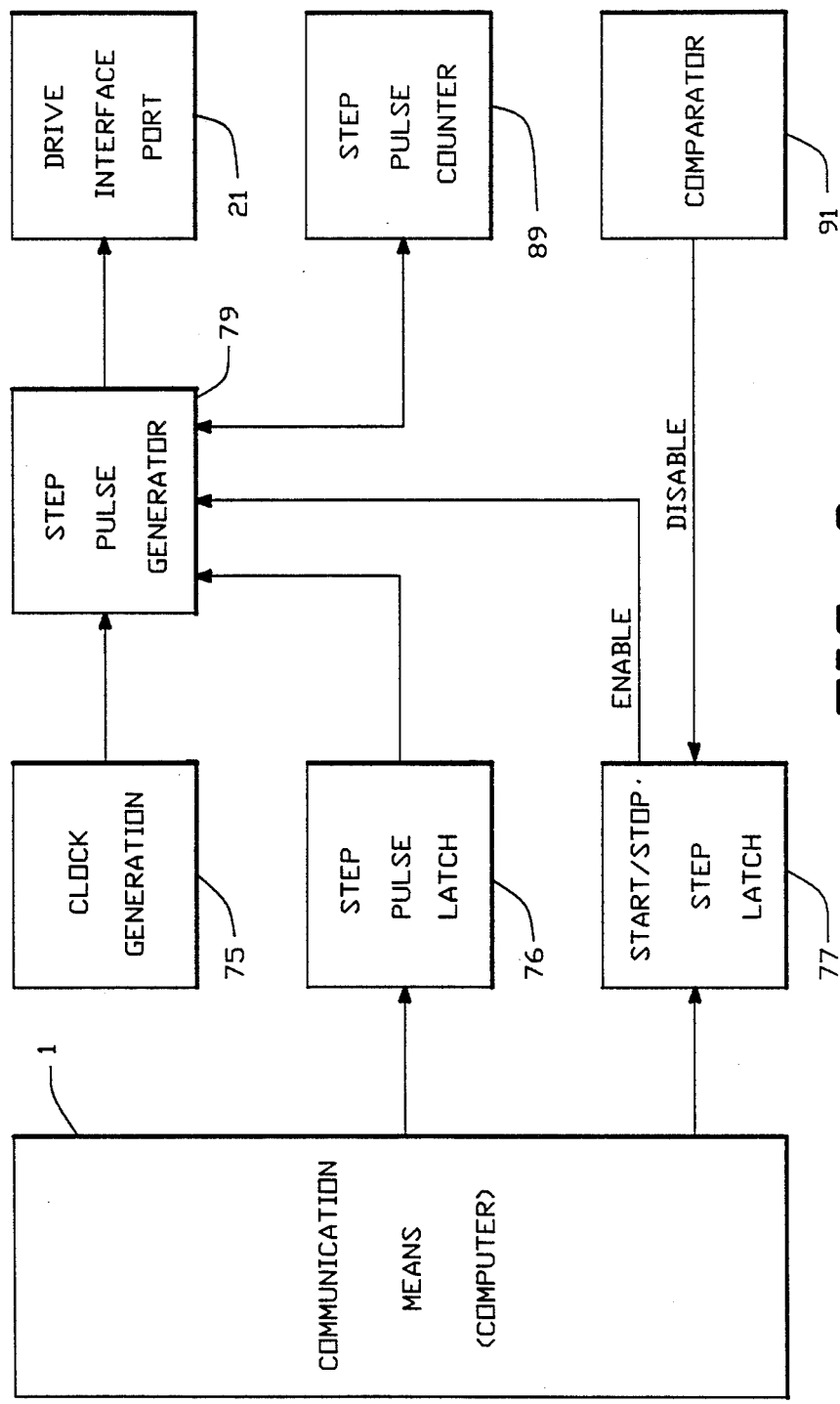
FIG. 3 is a block diagram showing in more detail the programmable step pulse generator located on the drive control board as described in FIG. 2.

FIG. 3 details an embodiment of the programmable step pulse generator 29 in FIG. 2 used to position the transducer over a desired track. The programmable step pulse generator consists of a clock 75, a step pulse latch 76, a start/ stop step latch 77, a step pulse generator 79, a step pulse counter 89 and a comparator 91.

The clock 75 generates step pulses by dividing down the 10 MHz signal from divider 24 into 1 MHz and 100 KHz signals which are input to the step pulse generator 79. The step pulse latch 76 latches a step count from the host computer 1, which will be used to seek the drive to a particular track. The host 1 then issues a set pulse to the start/ stop step latch 77 which enables the step pulse generator 79. The step pulse generator 79 starts issuing step pulses to the drive interface port 21 to drive the disc drive actuator and transducer to a desired position. The step pulse counter 89 in conjunction with the comparator 91 monitors the step pulses generated by the step pulse generator 79. When the count of the step pulse counter 89 equals the step pulse latch value registered by the step pulse latch 76, the comparator 91 issues a disable signal to the start/stop step latch 87 which disables the step pulse generator 79. It should be noted that the step pulse generator which generates the step pulses is under program control and can vary step pulse period to modify the travel rate of the transducer.

Figure 4A:
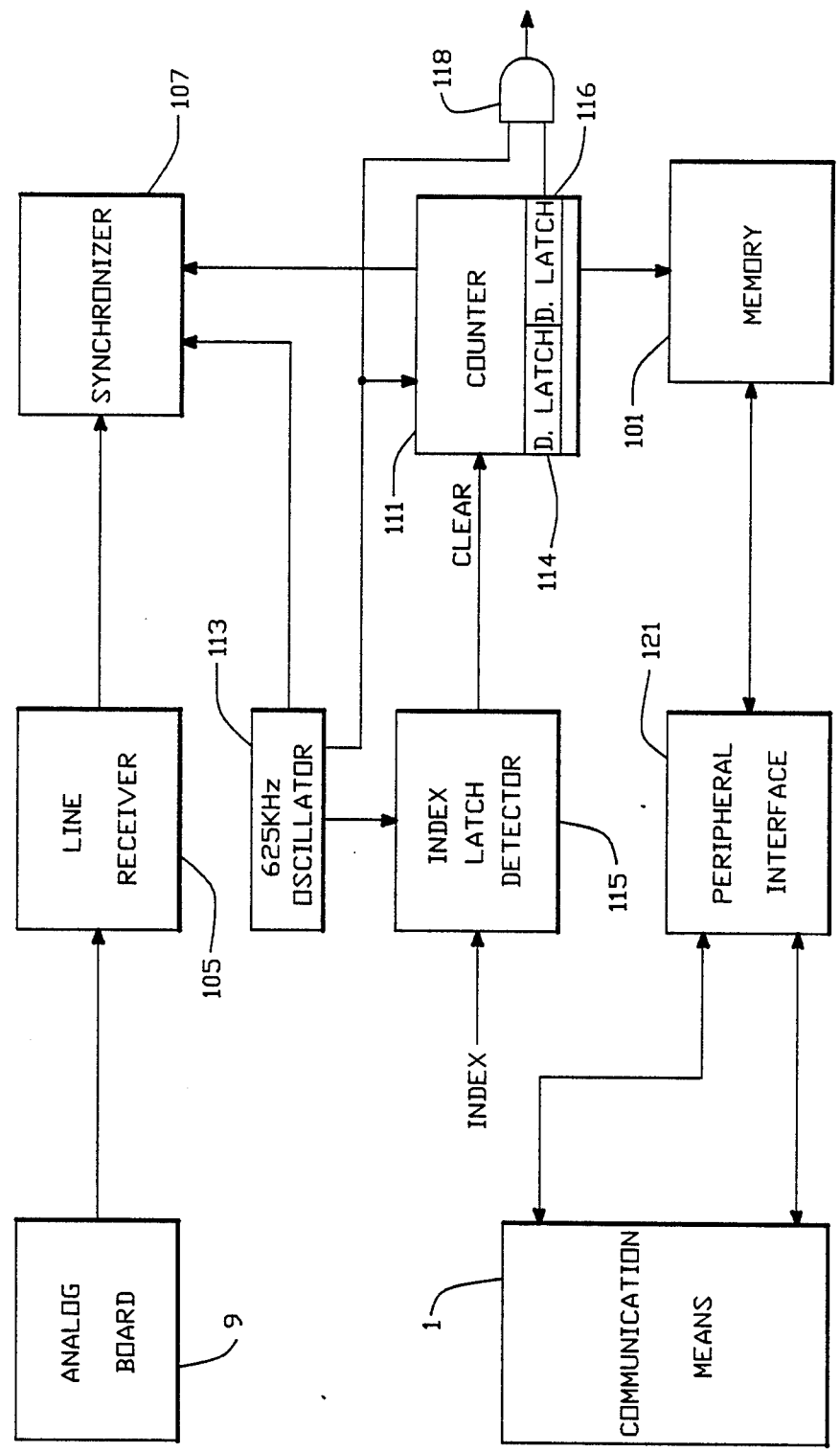
FIGS. 4A, B, C are a block diagram showing an interface board designed in accordance with this invention, the counter circuit and a timing diagram showing the timing of various signals appearing in the synchronizer, which is part of the interface board described in FIGS. 3 and 4.
Figure 4B:
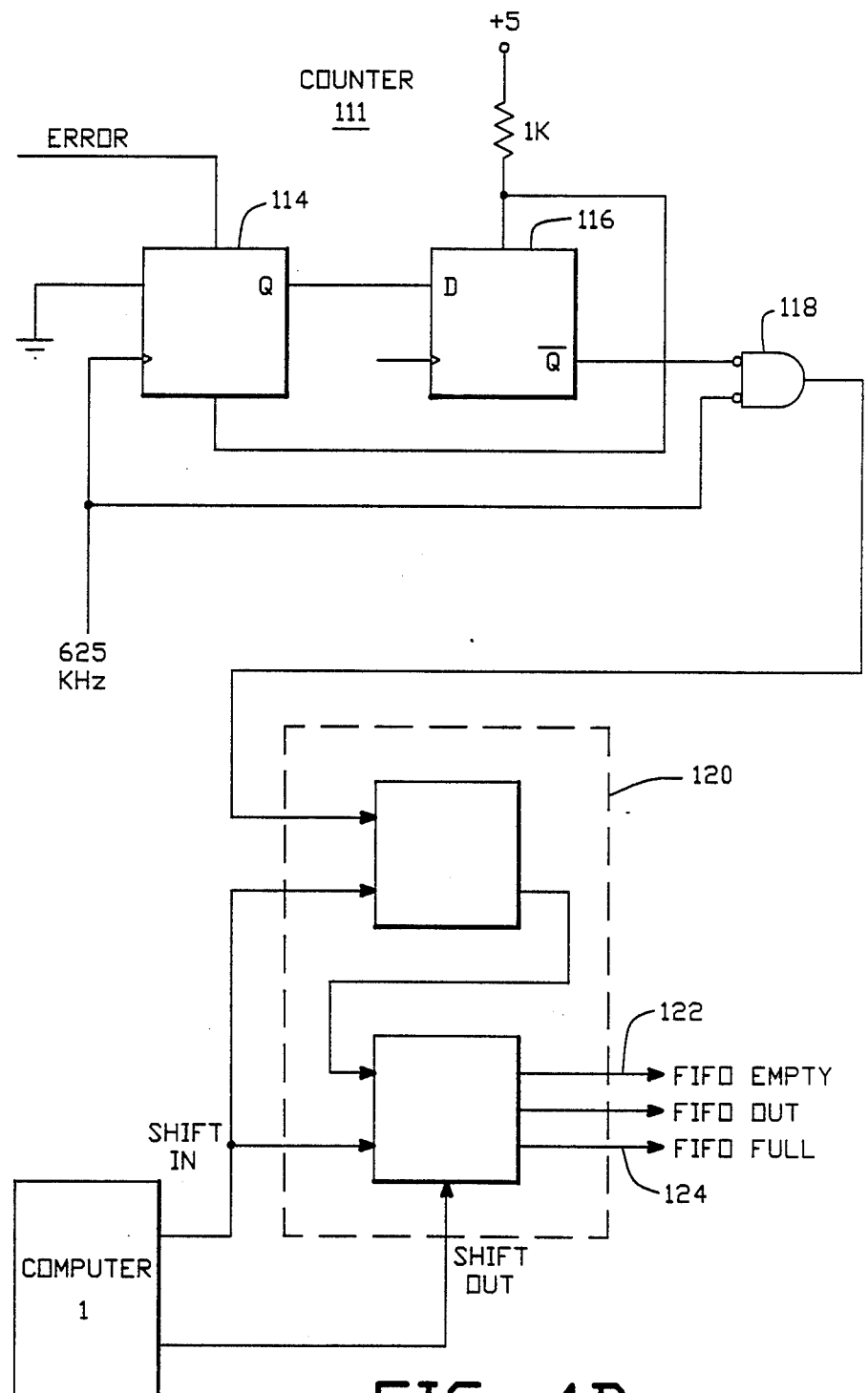

FIG. 4 shows the interface board 7 described in FIG. 1 used in this invention. The interface board 7 performs two functions: first, it handles interface of data and control line signals between the analog test board 9 and the computer 1. Second, it records the errors as they occur in time from index (bytes from index) and stores them in memory 101 for retrieval by the computer 1.

Defect signals come into the interface board 7 from the analog test board 9. The defect signals are in the form of a digital pulse. These signals are received through the line receiver 105 and passed on to the synchronizer 107. The synchronizer 107 uses an oscillator signal (preferably at 625 KHz) from the oscillator 113 to synchronize the defect signals so that the counter 111 may count them as they are received.

This frequency from oscillator 113 is representative of the byte wide data rate of MFM encoding. During normal operation with no errors coming in, the first D-latch 114 of synchronizer 107 (see FIG. 4B) clocks in zeros on each positive going edge of the clock input. The Q output of this first latch (low) is fed into the D input of the second latch 116. This low state propagates through on the next clock cycle as a high at $\overline{Q}$ of the second latch. Gate 118 is an AND gate with inverting inputs. The $\overline{Q}$ from the previous latch is input into one of the inputs to the AND function gate 118. In the scenario described above, the output of the $\overline{Q}$ would be false (high) to the AND gate 118 and would not meet the requirements necessary to make its output go true.

In the event an error occurs, a low state is directed to the PRESET input of the first D-latch 114. This occurrence will cause the output of the first latch to become high. The period of the defect error may be extremely short (>25 ns) and still set the output of the first D-latch 114 high. On the next positive going cycle of the clock after the error occurs, the high state of Q at the first latch 114 will be clocked into the second latch 116. This will cause the $\overline{Q}$ input of the second latch 116 to be forced low. At this time, half the requirements to make the output of the AND gate 118 true have been met. The $\overline{Q}$ is now low (true). Also at this time, since the clock has just gone from low to high, the clock input to the AND gate 118 is false (high). In the next half cycle of the clock, the clock will be low making its half of the AND input true. The $\overline{Q}$ output of the second latch 116 remains as it was before, low (true). Both inputs of the AND gate 118 now satisfy the requirements to make the output true (low). The AND gate output will remain high until the clock goes high (false) at the AND input. When no error is present at the PRESET INPUT a false condition will propagate through to the $\overline{Q}$ of the second latch, again violating the AND condition. The output of the AND gate 118 is the synchronized error signal. A timing diagram of all this is shown in FIG. 4C.

As errors occur, there is a need to know when they occur in the form of (i.e., timed from) bytes from index. This requires the counter 111, running at the MFM frequency of 625 KHz, and an index latch/detector 115 to gate the counter 111. The counter 111 starts at index and runs through exactly one revolution to the next index. The index latch detector 115 defines the index to index window. It controls the counter 111 start point by releasing the counter clear line 117 at index. It also prevents errors from passing when not in the prescribed index to index window by gating the output of the error AND gate 118. The index to index gate is controlled via the /CLR line of detector 115. This line is controlled at the host computer's bus through a peripheral interface 121. Control of the index timing is done through the index to index gate 119 which is connected through the peripheral interface 121 to the computer 1.

Now that a means of error detection/synchronization and a means for timing from index have been disclosed, a means for buffering errors for later recall is required. This is achieved by clocking the counter value into memory each time an error occurs. The devices selected for performing the task are FIFO memory chips.

As signals are received, the location of errors detected are stored for later recall by clocking the counter value into memory 101 each time an error occurs. At the end of the error gathering cycle, the contents of memory 101 are retrieved by the computer 1 through the peripheral interface 121.

In a condition where the error gate 118 is open and the counter 111 is running, an error may occur and be detected. The clock to the counter 111 is the reciprocal of the synchronized error pulse; by inversion, (FIG. 5) the counter 114, 116 is set up as valid when the count is shifted into the FIFOs 120. As a SHIFT IN command goes to the FIFOs 120 the address (count) of the counter 114, 116 is put onto the FIFO stack 120. This "stacking" of error locations goes on until the index closes the gate or FIFO 120 overflows, which in this embodiment occursat a count greater than 62. At the end of the error gathering cycle, the contents of the FIFOs 120 may be retrieved by SHIFTING OUT the accumulated data. The shifting out of the data is controlled by the host computer 3 via peripheral interface chips on board. SHIFT OUT is pulsed and the data retrieved until the FIFO EMPTY line 122 goes true. At this point all errors on the track have been stored in memory 101. If the FIFO FULL line 124 is true on first evaluation (the first read after sample taken), this information, "excessive errors for this track" can be noted. If the FIFO EMPTY line 122 is true on first evaluation, there were no errors recorded this track now under test on this disc drive. The details of necessary timing signals appear at the top of FIG. 4C.

Figure 6:
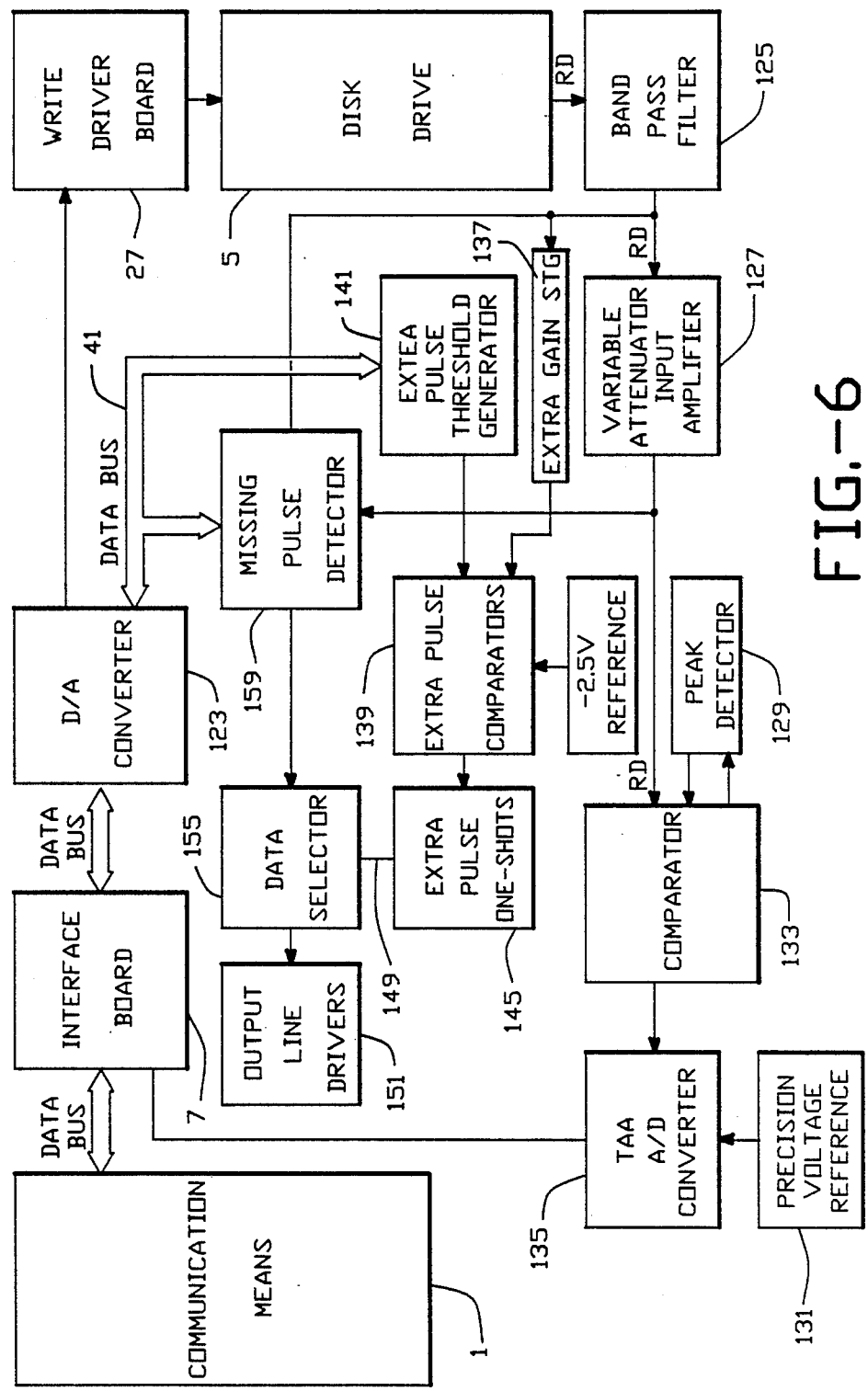
FIG. 6 is a block diagram showing the testing board which carries out the testing of the disc drive in accordance with this invention.
Figure 7:
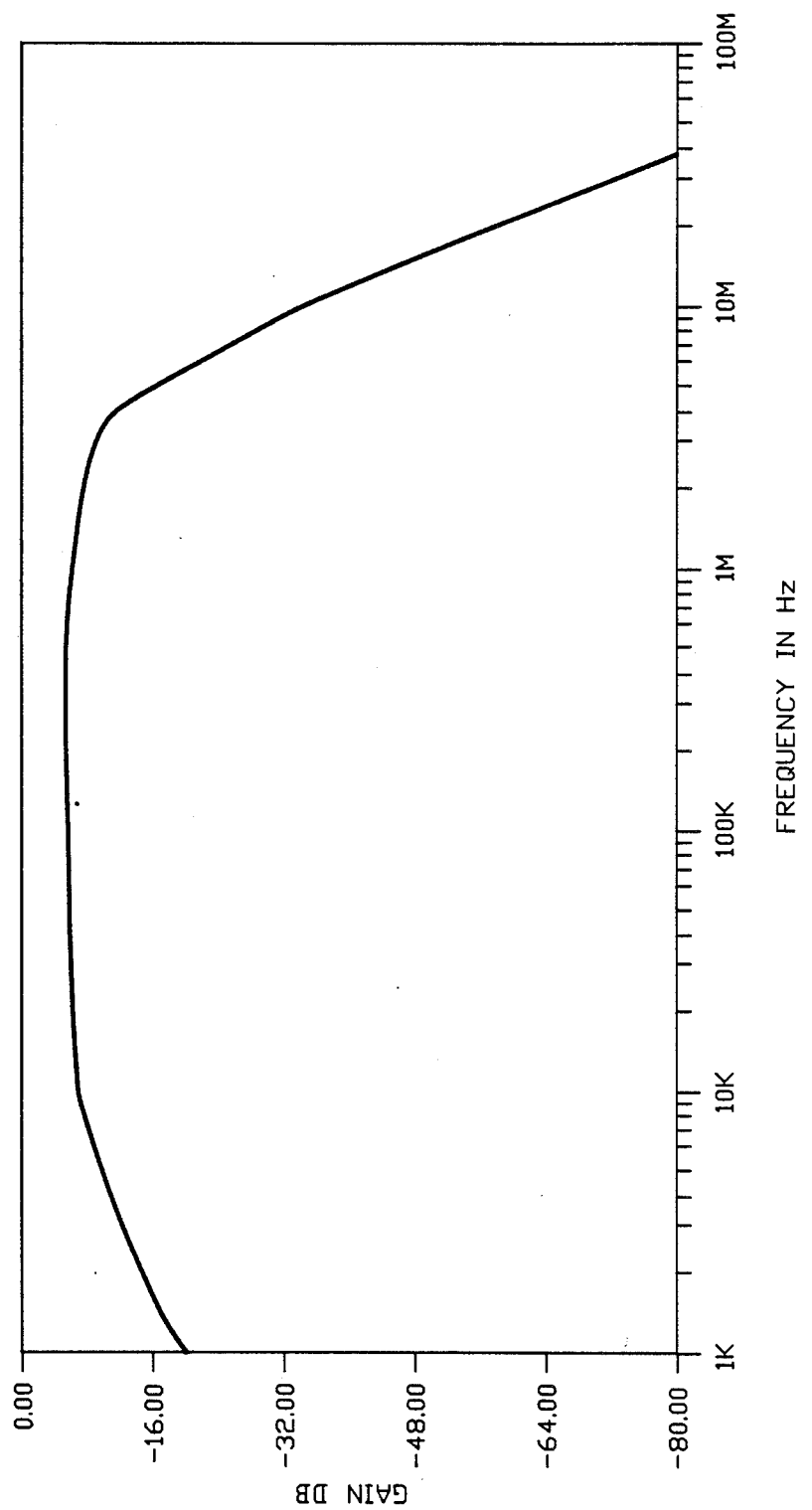
FIG. 7 is a bode plot showing the response of a typical band pass filter which is located on the testing board described in FIG. 6.

FIG. 6 shows an embodiment of the analog test board described in FIG. 1 in accordance with the invention. The computer 1 sends a digital signal representing the magnitude of write current to be used in the disc drive 5. The write current magnitude signal is then transmitted on the data bus 41 through the interface board 7 to the digital to analog converter 123 (D/A). The D/A converter 123 converts the write current magnitude signal to an analog signal. This analog signal is then transmitted to the write driver 27 which issues directions to the disc drive 5 to use a write current of the magnitude initially sent by the computer 1.

Read data input signals from the disc drive 5 are received by the band pass filter 125. The band pass filter 125 reduces extraneous noise and feeds the read data input signals to the variable attenuator input amplifier 127. The variable attenuator input amplifier 127 normalizes the filtered read data input signals received from the band pass filter 125 to a predetermined level.

The peak detector 129 provides a DC level that is proportional to the peak value of the read data signal read from the HDA. This DC level is input to the first input of the comparator 133. The normalized read data signal is input to the second input of the comparator 133. The output signal of the comparator 133 represents a DC level that follows the peak of the envelope of the AC read data input signal. The output signal is then converted to a digital signal by the track average amlitude (TAA) analog to digital converter 135 (A/D).

The A/D converter 135 determines the track average amplitude by sampling the peak detected and normalized read data input signal at maximum rate from index to index. All of these reads are then averaged to come up with the track average amplitude.

Extra pulses are detected with the track DC erased. The typical extra pulse error threshold is approximately 20% of TAA as established during the missing pulse test. In order to make the extra pulse threshold some reasonably high voltage level, an extra gain stage 137 is inserted between the band pass filter 125 and the extra pulse comparators 139. This extra gain stage amplifies the extra pulse signal level so that it is easier to detect.

The extra pulse threshold generator 141 provides a computer generated extra pulse threshold. The D/A converter 123 receives information from the data bus 41 and generates a DC level that is proportional. The predetermined extra pulse threshold is selectable by the user from the computer 1.

The predetermined threshold signal level esablished proportional to TAA during the missing pulse test is presented by the extra pulse threshold generator to the first input of the extra pulse comparator 139. The filtered read data input signal is presented to the second input of the extra pulse comparator 139. When the filtered read data input signal exceeds the predetermined threshold signal level the output of the extra pulse comparator 139 goes low. Therefore, each time an extra pulse occurs that exceeds the extra pulse threshold, a pulse will appear at the output of the extra pulse comparator 139. The pulse width is dependent on the amount of time the signal exceeds the threshold. This pulse is used to trigger the extra pulse one shots 145.

The extra pulse one shots 145 are used to normalize the output pulse width of the extra pulse comparator 143. The extra pulse one shot minus line 147 outputs directly to the interface board 7 via the output line drivers 151. The extra pulse one shot plus line 149 connects the extra pulse one shots 145 to the data selector 155, which selects between the extra pulse one shot plus line 147 and the missing pulse data line 157.

The missing pulse detector 159 compares the read data input signal to the predetermined missing pulse threshold received on the data bus 41. Each of the positive half cycles of the read data input signal should exceed the predetermined missing pulse threshold and retrigger the mising pulse one-shot. Each time this missing pulse one shot is triggered, the signal level on the missing pulse data line 147 is maintained. The missing pulse data line 157 connects the missing pulse detector 159 to the data selector 155. A missing pulse with allow the one-shot to tune ou, predicating the error condition by the change in signal level on line 157.

The data selector 155 is designed to multiplex extra pulse plus errors and missing pulse errors to the interface board 7. The output line drivers 151 receive extra pulse minus signals from the extra pulse one shots 145 on the extra pulse one shot minus line 147, and extra pulse plus signals and missing pulse error signals from the data selector 155. The output line drivers 151 then output these signals to the interface board 7.

Finally, details of the schematic diagram of the test board which couples the tester to the disc drive will be explained with reference to FIG. 5. The output of the write driver control circuit 21 (FIG. 2) is connected to the write driver LSI 27 on the captive board of FIG. 5. The purpose of this circuit is to control the magnitude of write current when writing on a track. When write gate is active, line 130 will be a 2.4 volt voltage source. The write driver control circuit sinks current from that source. The write current is directly proportional to the amount of current sunk by the write driver control circuit. The 8-bit D/A converter 5C gets information from the data bus 41, bits D0 through D7. When the bus equals 0, the maximum amount of write current is provided; when the bus equals 255, the minimum amount of current, or zero current, will be provided. The 2.5 volts coming in on line 130 is fed into the input of operational amplifier 4D pin 9. Op-amp 4D and resistor R34 are used to adjust for inaccuracies in the voltage level, i.e., to regulate the voltage level t exactly 2.5 volts. As more current is drawn, the voltage will decrease somewhat. Resistor R34 is adjusted so the maximum current and minimum current are correct, thus spreading the nonlinearity over the entire range of write currents.

The output of operational amplifier 4D8 provides the reference voltage for the 8-bit D/A converter 5C. The output of the D/A converter is at pin 1 and is fed into the input of op amp 4D13. As the output of D/A converter 5C1 gets higher and higher, the output of op amp 4D14 goes lower and lower, which turns on transistor Q1. The lower op amp 4D14 goes, the more transistor Q1 turns on and the more current is sunk through resistor R32.

Resistor R32 is adjusted for the desired maximum current with the D/A converter 5C bits set to 0. The −2.5 volt reference generator provides a precision reference voltage to which errors are compared. The −5 volt reference, coming from a 3-pin regulator (not shown), is divided by resistors R11, R12 and R47. Resistor R47 is adjusted to provide exactly −2.5 volts at op amp output 2D-8, providing a low impedance −2.5 volt reference.

The variable attenuator input amplifier 134 is designed to receive the filtered read data signal from the captive drive board, and normalize the signal output to a predetermined value.

Resistors R40 and R43 provide bias for amplifier 4F. The gain of amplifier 4F is changed by varying impedance across amplifier pins 4 and 11. This is accomplished by using transistor Q2 as a voltage variable resistor. As the voltage on the gate of transistor Q2 goes up, impedance across the source drain of transistor Q2 also goes up. This provides very low gain. As the gate voltage goes down, the impedance of transistor Q2 goes lower and increases the gain of amplifier 4F. The gate voltage of transistor Q2 is controlled by the D/A converter 4C and the op amps 4D1 and 4D7. When the D/A converter 4C has input representing 255, output at op amp 4D1 is approximately equal to the reference voltage at D/A converter 4C15 (except it will be a minus because of the inversion of op amp 4D). When 0 is input to the D/A converter, the output at op amp 4D1 will be approximately 0 volts.

This reference voltage is set by the number of diodes CR2 used to accommodate the large variations in FET Q2 parameters from part to part. This selection is done when the tester is first brought up and will not change unless the FET is changed. The output of op amp 4D1 is summed with resistor R49 at op amp 4D6. Resistor R49 is adjusted to center the range of op amp 4D1 to the center of the operating point for the particular FET Q2 installed.

The set gain operation sets the gain so that a 1 volt peak to peak differential signal across video amp 3F pins 1 and 14 is achieved. This is done by successively setting the gain by changing the count into D/A 4C and then reading the TAA A/D IC until the value is correct.

Figure 5A:
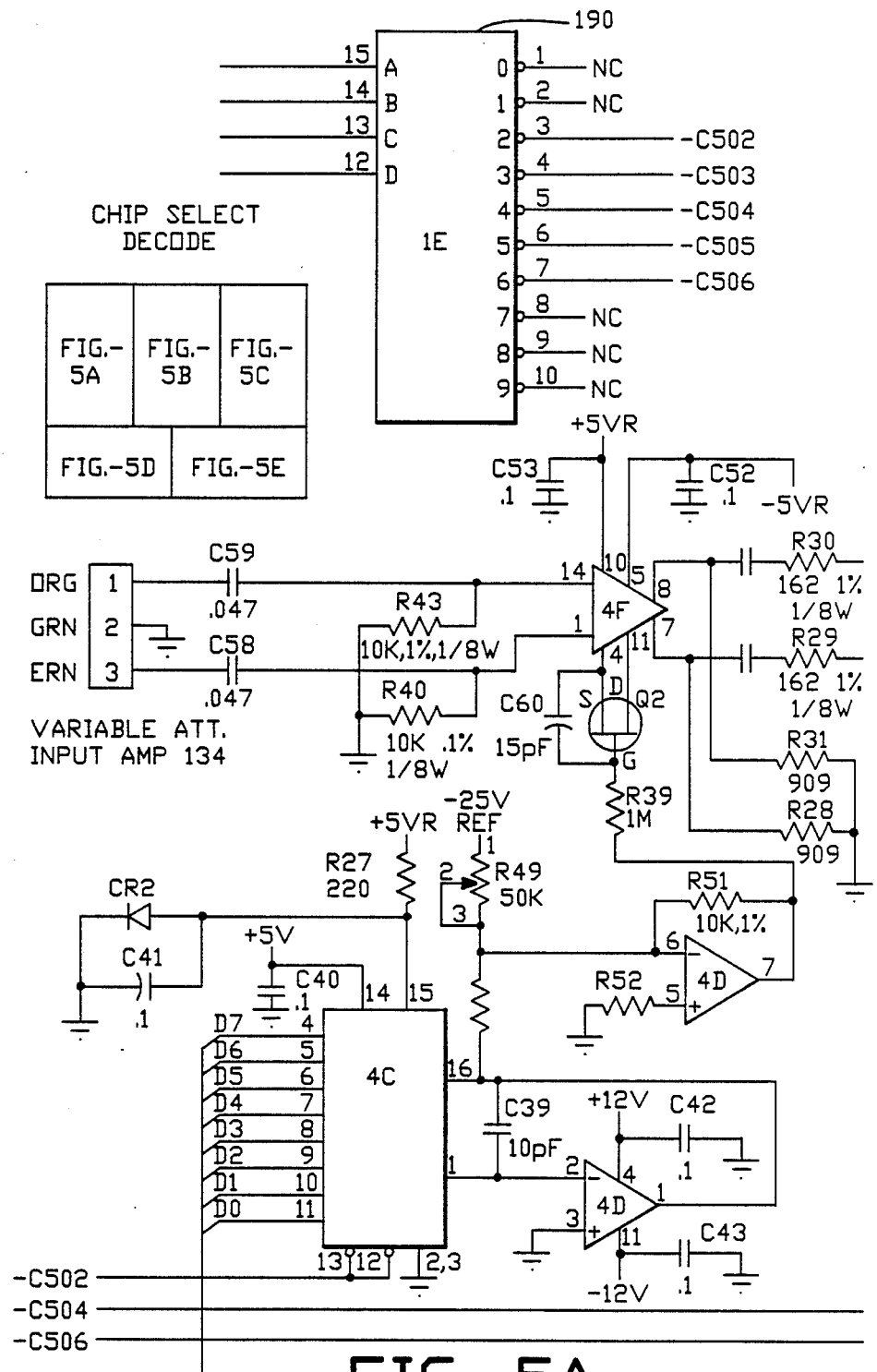
FIGS. 5A-E is a detailed schematic diagram of the analog circuit board of this invention.
Figure 5B:
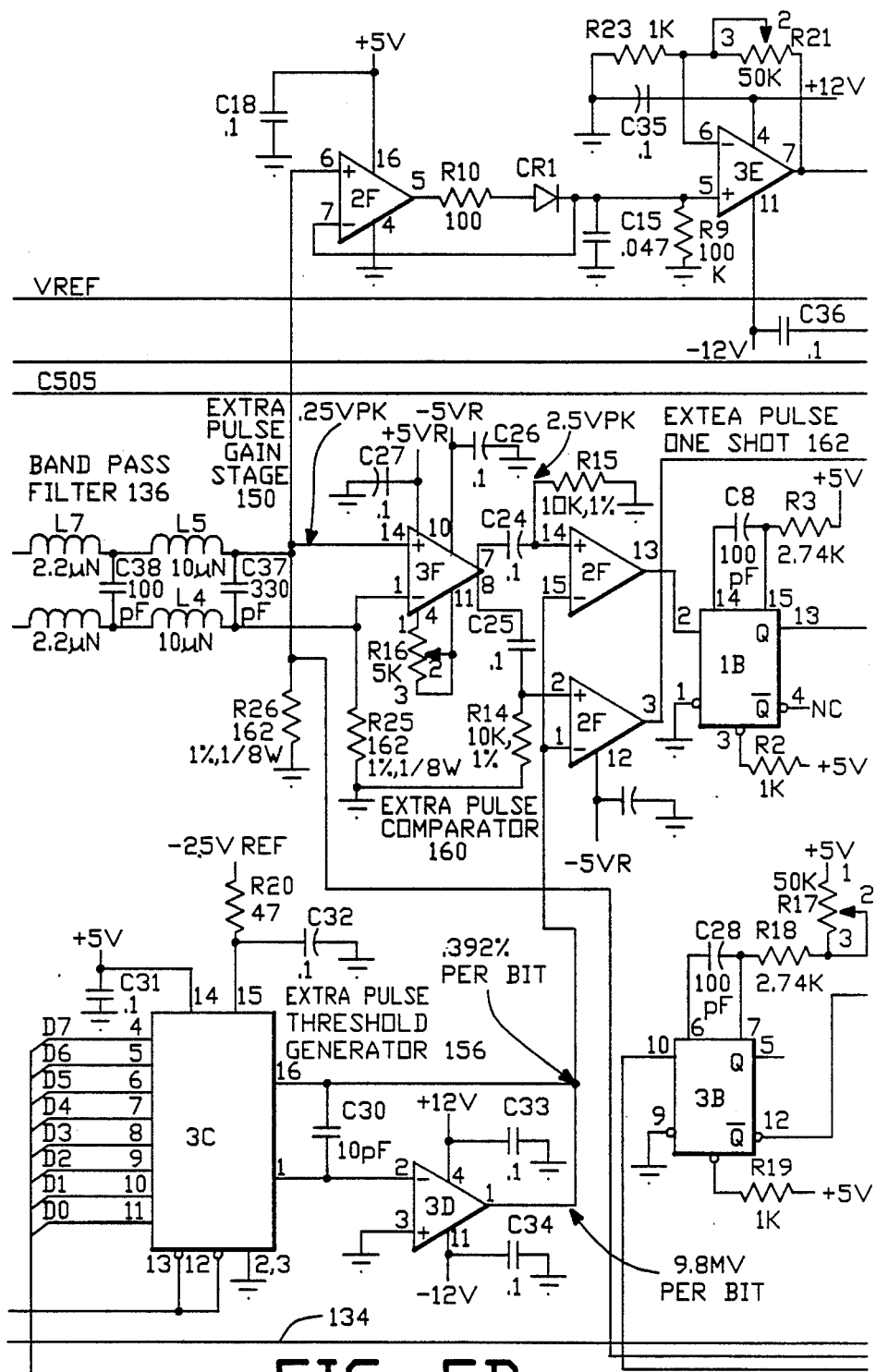
Figure 5C:
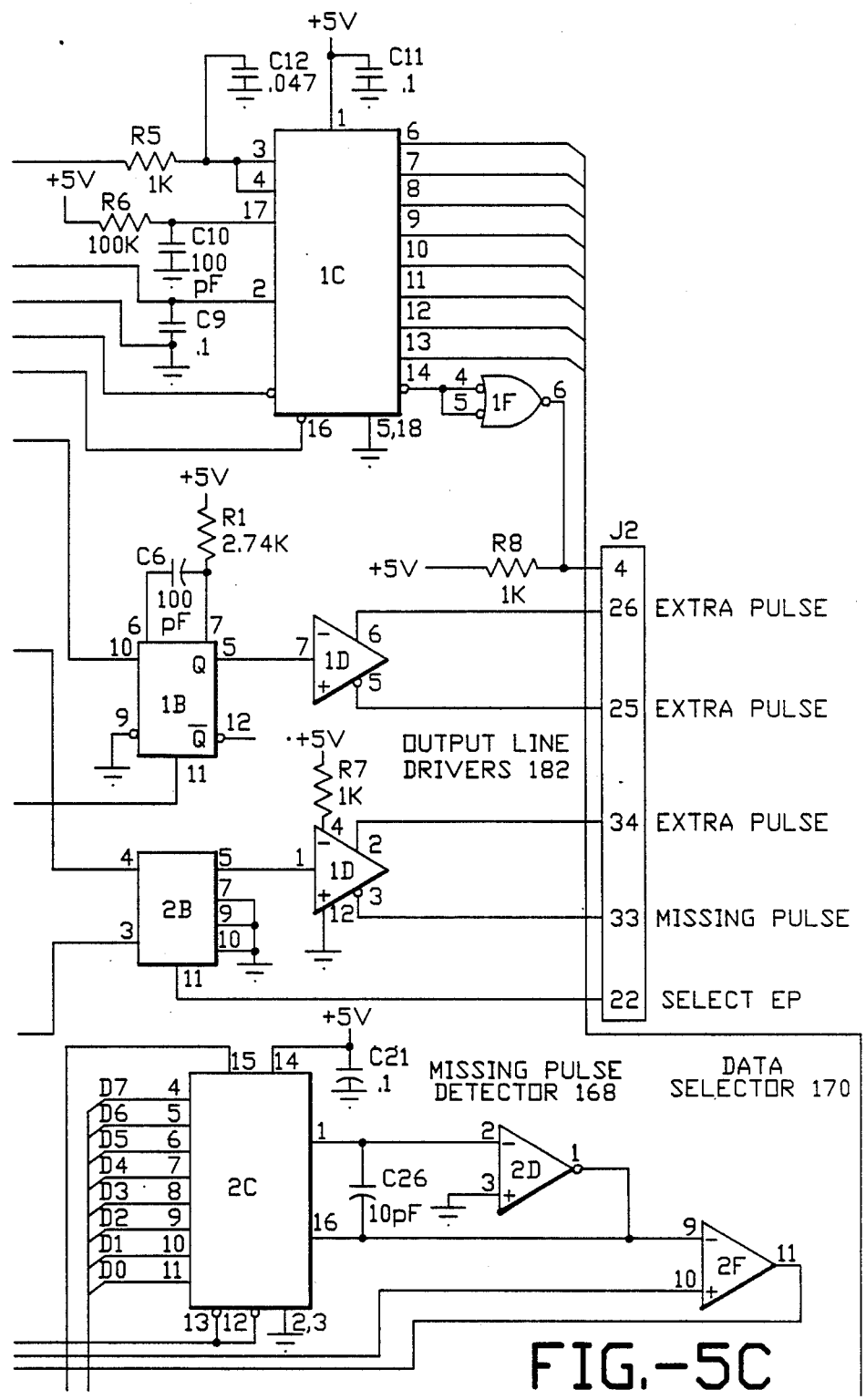
Figure 5D:
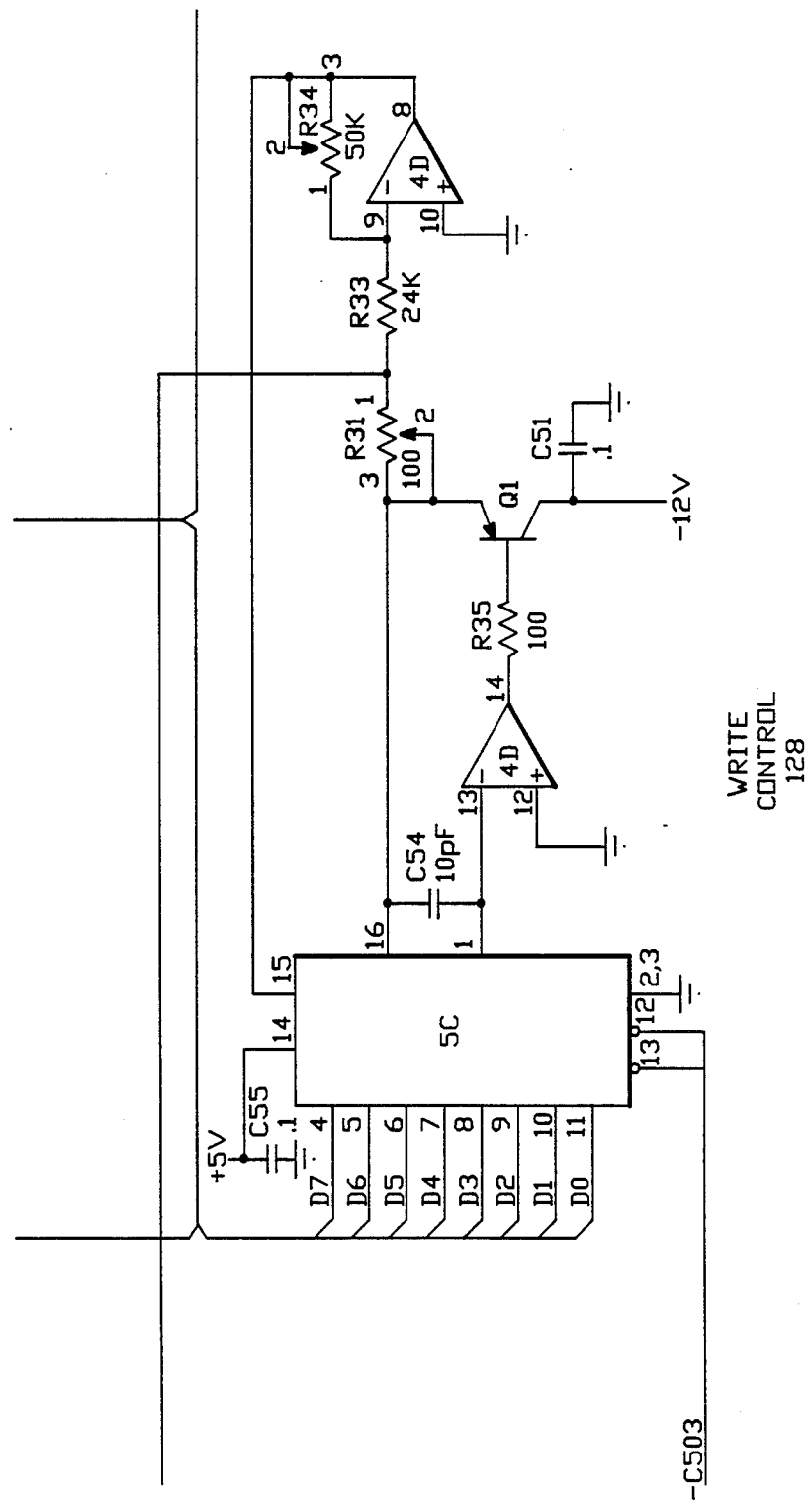
Figure 5E:
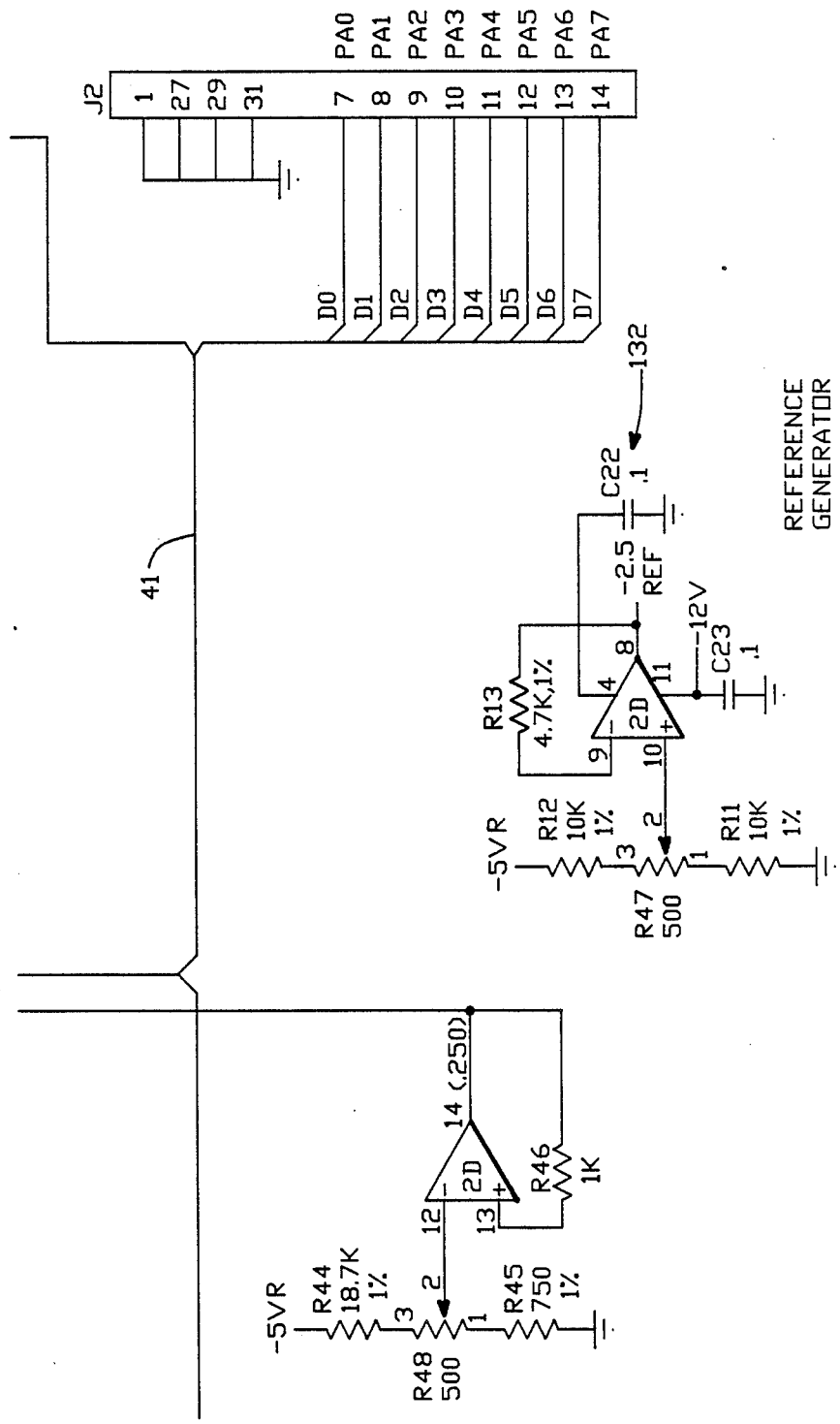

The band pass filter is designed to reduce extraneous noise by attenuating frequencies that are below 10 KHz and above 2.5 MHz. FIG. 5B is a bode plot of the filter response which is to be provided by filter 136.

The peak detector 140 provides a DC level proportional to the peak value of the signal at op amp 3F14. The analog read signal is fed to comparator 2F pin 6. When it reaches a value greater than the minus input at comparator 2F pin 7, the output at comparator 2F goes high. This forward biases diode CR1 and capacitor C15 starts to charge up. As the analog read signal swings back down and falls below comparator pin 7, comparator pin 5 goes low, reverse biases diode CR1 and capacitor C15 holds that charge. The discharge time of capacitor C15 is controlled by resistor R9 and the input impedance of op amp 3E. As the analog read signal swings back plus again and exceeds the new level on op amp pin 7, op amp pin 5 goes high, and starts charging capacitor C15 again. After some number of cycles, capacitor C15 has been charged up as high as the analog read signal and cannot be charged any higher. The peak detector 140 will follow the envelope of a modulated analog read signal. If the analog read signal increases, then capacitor C15 can be charged to a higher value. If the analog read signal decreases, capacitor C15 discharges through resistor R9 and the input impedance of op amp 3E. Capacitor C15's charge time is controlled by the value of resistor R10 and the source current capability of comparator 2F. Capacitor C15's discharge time is controlled by the value of resistor R9 and the input impedance of op amp 3E. The output then is a DC level that follows the peak of the envelope of the AC input signal. This is used by the TAA A/D 142 to determine the track average amplitude.

The TAA A/D converter 144 is used to convert the peak value of the analog read signal into a digital value for the computer 3. The TAA A/D 144 is used to sample the peak detected analog read signal at maximum rate from index to index (approximately 95 reads per revolution). All these reads are averaged to come up with the track average amplitude.

The A/D converter 144 is a successive approximation A/D converter. Resistor R6 and capacitor C10 are the timing components for the internal clock. A precision −10 volt reference is fed into pin 2 of the A/D converter, 1C. The amplified peak detected signal is fed into pins 3 and 4. The device is then chip selected and when READ is pulsed low, the A/D converter 144 starts its conversion cycle. BUSY goes low when the conversion cycle starts, and stays low until the conversion is complete. When BUSY goes high, an 8-bit digital word is output to the data bus proportional to the analog input signal.

Extra pulses are measured with the track DC erased. The normal threshold is approximately 20% of TAA. In order to make the extra pulse threshold some reasonably high voltage level, an extra gain stage is inserted between the filter 136 and the extra pulse error comparators described below. Amplifier 3F is a 592 video amplifier. Resistor R16 is set for a gain of 10. This allows the extra pulse error threshold to be 10 times larger than it would be with no extra gain stage. During the missing pulse test, when signal 2F is written on the track, amplifier 3F's output will appear to be saturated, but this is normal operation.

The extra pulse threshold generator provides a computer generated extra pulse threshold. The D/A converter 3C receives information from the data bus 41 and generates a DC level that is proportional. That DC level is equal to 0.392% per bit, or 9.8 millivolt per bit. The operating extra pulse threshold is selectable from the keyboard. The figure shows the signal level at various points in the circuit. Because the extra pulse test is done with the track erased, the TAA is determined by the signal levels established during the missing pulse test when 2F is written on the track. The gain is adjusted so that 0.25 volt peak is present at op amp 3F14 and 2.5 volt peak at op amp 2F-14. The precision 2.5 volt reference is divided by 255, which yields 9.8 millivolts per bit. This threshold is presented to the extra pulse comparators at comparator 2F to detect the presence of extra bits in the recovered data.

Op amp 2F is a differential high speed comparator. It compares the programmable extra pulse threshold to the signal level presented at the plus input of the comparator. When the signal level exceeds the threshold, the output pin of comparator 2F-13 goes high. When the signal goes back below the threshold, comparator 2F-13 goes low. Therefore, each time an extra pulse occurs that exceeds the extra pulse threshold, a pulse will appear at the output pin of the comparator 2F. This pulse width is dependent on the amount of time the signal exceeds the threshold. This pulse is used to trigger the extra pulse one shots which will develop a record of the extra bits.

The extra pulse one shots 162 1B are 74221 nonretriggable one shots. They are used to normalize the output pulse width of the extra pulse comparators to approximately 1 bit time or 200 nanoseconds. The EXTRA PULSE one shot outputs directly to the interface via the EXTRA PULSE line driver 1D. The EXTRA PULSE one shot is fed to a data selector, 2B, that selects between EXTRA PULSE plus and MISSING PULSE data.

The missing pulse detector 168 compares the comparators 2F analog read data signal to the missing pulse threshold. Resistors R44, R45, R48 divide the −5 volt reference down −0.250 volts. Resistor R48 is adjusted for exactly −0.250 volts at op amp reference generator 2D14. Op amp 3E is used to provide a low impedance −0.25 voltage reference for the missing pulse D/A 2C.

Comparator 2F compares the analog read data signal to the missing pulse threshold presented at pin 9 comprising an analog signal derived from the digital input data on bus 41. Each of the positive half cycles of the analog read data signal at comparator 2F10 should exceed the threshold. Each time this occurs, an output pulse occurs at comparator 2F-11. Comparator 2F-11 is fed to a retriggerable one shot 3B. Resistor R17 is adjusted for an output pulse width of 600 nanoseconds. If there are no missing pulses, one shot 3B will be triggered every 400 nanoseconds. If one or more of the pulses does not exceed the threshold, then one shot 3B times out and $\overline{Q}$ (3B-12) goes high. This is considered to be a missing pulse or a group of missing pulses. The one shot output, 3B-12, is fed to the data selector 2B.

The data selector 170, 2B, is designed to direct extra pulse plus errors and missing pulse errors to the interface. When pin 22 of selector J2 goes low, extra pulse errors are selected. When pin 22 of selector J2 is high, missing pulses are selected.

The output line drivers 182 receive Extra Pulse and Missing Pulse errors and drive them differentially to the MDT interface board (FIG. 2). These drivers are standard RS422 drivers.

The chip select decoder 190 is a 7442 four to ten line decoder. It receives PB0 through PB3 from the MDT interface board (FIG. 2) and outputs chip selects. Chip select 2 selects the variable attenuator D/A 134. Chip select 3 selects the write driver D/A 128, 5C. Chip select 4 selects the extra pulse threshold D/A 156, 3C. Chip select 5 selects the TAA A/D 144. Chip select 6 selects the missing pulse D/A 168. Chip select 0 and 1 are not used.

Although this test system is designed to be fully automatic, the system can be operated manually to bring up any of the functions available on the tester. A review of these functions is presented below, as it reviews the essential operations of the test system.

Function 1, set gain D/A, allows the operator to set a value from 0 to 255 in the gain set D/A. This controls the amount of gain in the first amplifier.

Function 2, set write current D/A, allows the operator to set a desired write current. It allows a number from 0 to 255, where 0 is the maximum current and 255 is the minimum current, usually 0. The value of each step is equal to the maximum current divided by 255.

Function 3, set EP threshold, allows the operator to set any desired extra pulse threshold from 0 to 100% in whole percent numbers. This percentage is a percentage of the track average amplitude (TAA). This percentage is valid only if the auto gain set function has been run on the current head and track.

Function 4, set missing pulse (MP) threshold, allows the operator to set the MP threshold to any value desired from 0 to 100% in whole percent numbers. This percentage is valid only if the auto gain set function has been run on the current head and track.

When function 5, write gate on, is selected, write gate is turned on and the drive writes the selected write data until write gate is turned off by executing function 6.

When function 6, write gate off, is selected, the program makes sure that write gate is turned off. This is usually used in conjunction with function 5, which turns write gate on.

Function 7, select write frequency, allows the operator to select between 1F, 2F, DC, or external write frequency. When function 7 is entered, the computer will prompt 1 for 1F, 2 for 2F, 3 for DC and 4 for external write frequency. At this time there is no external write frequency and the track will be DC erase when external is asked for.

Function 8, seek to track, commands the drive to seek to any legal track and then updates the current parameter list.

When function 9, select head, is selected the program asks for the desired head. The desired head is then entered. The head is selected and the current parameters list is then updated to reflect the current selected head.

Function 10, Read TAA, monitors the output of the track average amplitude A/D converter and continuously displays the present value on the monitor. The output value runs from 0 to 255. When the tester is calibrated, a value of 200 equals 1 volt peak to peak at the filter output of the MDT analog board. This is the level used in the MDT test.

When function 11, write 1 revolution, is selected, the program will prompt for the data pattern to be written and will write from the leading edge of index to the leading edge of the next index.

Function 12, recall drive, recalibrates the drive from any cylinder back to cylinder 0.

Function 13, auto gain set adjustment, duplicates the gain set routine in the MDT test. It writes 2F signal and then adjusts the gain set D/A so that the TAA reading is 200 plus or minus 1. This test is useful when manually setting the extra pulse (EP) or missing pulse (MP) thresholds and looking for errors.

Function 14, TAA vs. gain data plot, is used to generate a plot of the gain set D/A vs. the TAA reading. The data is dumped to a diskette and the diskette is then used to input numbers to a separate graphics program to generate a gain plot for the particular variable attenuator.

Function 15, EP test at current track and head, does the EP test just as it would be done in the regular operation of the tester. It writes 2F, sets the proper gain, and then does the DC erase and the minimal current erase. It then performs the EP test for the desired number of revolutions. It gives the operator the option of writing each time the EP test is done, or writing once and doing several EP tests. The results are sent to the printer.

Function 16, MP test at current track and head, does the missing pulse test of current track and head. It works in the same manner as the regular operation of the tester.

The tester writes 2F and does the missing pulse test the number of requested times. It allows the option of writing for each missing pulse test or writing once and doing several missing pulse tests. The results of the test are sent to the printer.

Modifications of the above invention may become apparent to a person of skill in the art who studies the invention disclosure. For example, the same principles could be applied to a parallel tester to test all disc surfaces simultaneously.

What is claimed:

1. A micro defects tester for testing a rotating media storage device including read/write means and having a plurality of tracks, each track having an index and having a plurality of sequentially stored bits of binary data each of which can be set at one of two possible levels, comprising:

communication means enabling a user to transmit and receive communications from said defects tester;

control means connect ®d to said communication means for issuing steps and directions to said media storage device, selecting said read/write means, and providing signals to said media storage device;

interface means connected to said communication means and to said control means for measuring time from index to an error detected by said tester in said sequence of bits;

testing means connected to said interface means and said media storage device so that when a read data input signal is received from said media storage device, said testing means can measure said read data input signal in various ways, wherein, said plurality of bits are set to a first level;

said plurality of bits are set to a second level;

said plurality of bits are read and compared to a predetermined threshold signal level; and any of said plurality of bits, the level of which exceeds said predetermined threshold signal level, is considered defective.

2. A micro defects tester as in claim 1 wherein in the tester means:

said plurality of bits are set to said first level at full write current;

said plurality of bits are set to said second level at minimal write current;

said plurality of first and second bits are read and compared to said predetermined threshold signal level; and whereby any of said plurality of bits, the level of which exceeds said predetermined threshold signal level is considered defective.

3. A defects tester as in claim 2, wherein the control means further comprises:

buffer means for buffering signals received from said communication means; and decoding means connected to said plurality of buffers for decoding signals received from said plurality of buffers.

4. A defects tester as in claim 3 wherein said decoding means enable said buffer means whenever a valid decode signal is received from said communication means so that said control means may receive signals representing instructions for controlling said media storage device from said communication means or transmit signals representing media storage device status to said communication means.

5. A defects tester as in claim 3 wherein said control means includes an interface port, a plurality of input lines from said media storage device, and a plurality of output lines to said media storage device wherein, said interface port monitors said plurality of input lines and outputs control signals on said plurality of output lines in response to signals from said communication means.

6. A defects tester as in claim 5, wherein said control means includes a programmable step pulse generator connected between said communication means and said interface port to provide said interface port with timed step pulses determined by said communication means so that timing can be set up to position said media storage device to one of said plurality of tracks.

7. A defects tester as in claim 2, wherein said interface means handle interface of signals between said testing means and said communication means.

8. A micro defects tester as in claim 7 including a counter, wherein said interface means includes means for measuring said time from index to each detected error by controlling said counter to count up exactly one revolution to the next detection of said index whereupon said counter is reset, and recording means responsive to detection of an error to record the position of said error by storing the count of said counter from said index to said detected error for retrieval by said communication means.

9. A micro defects tester as in claim 8 wherein said interface means includes a memory device for storing said count from said counter for retrieval by said user through said communication means, whereby said user knows the location along said track of which of said plurality of bits are defective in terms of bytes from index.

10. A micro defects tester as in claim 2 wherein said testing means further comprises write driver control means set to a desired write current level by said user which is then applied to said media storage device by said read/write means whereby said full write current and minimal write current are established.

11. A defects tester as in claim 10 wherein said testing means further includes comparing means comprising:

a threshold generator connected to said communication, means which creates an extra pulse threshold signal the level of which depends on and is defined to exceed the level of data normally received from said communication means.

12. A defects tester as in claim 11 wherein the testing means comprises a comparator having first and second inputs and an output, said threshold generator provides an extra pulse threshold signal to said first input;

the read data input signal is provided to said second input; and said output is a first signal level if said extra pulse threshold exceeds said read data input signal and a second signal level if said read data input signal exceeds said extra pulse threshold.

13. A defects tester as in claim 12 wherein said testing means further includes missing pulse detecting means connected to said media storage device and said media storage device for receiving said read data input signal and detecting missing pulses.

14. A defects tester as in claim 13 wherein said testing means further includes selecting means for receiving said second signal level from said comparing means and for receiving a missing pulse signal from said missing pulse detecting means and for selecting which signal to send to said interface board.

15. A defects tester as in claim 14 wherein said testing means further comprises driving means connected to said selecting means, said comparing means, and said interface means, wherein:

said driving means receive said first signal level from said comparing means and then transmit said first signal level to said interface;

said driving means receive said second signal level from said selecting means and then transmit said second signal level to said interface means; and said driving means receive said missing pulse signal from said selecting means and then transmit said missing pulse signal to said interface means.

16. A micro defects tester for testing a rotating media storage device including read/write means and having a plurality of tracks, each track having an index and having a plurality of sequentially stored bits of binary data each of which can be set at one of two possible levels, comprising:

communication means enabling a user to transmit and receive communications from said defects tester;

control means connected to said communication means for issuing steps and directions to said media storage device, selecting said read/write means, and providing signals to said media storage device;

interface means connected to said communication means and to said control means for measuring time from index to an error detected by said tester in said sequence of bits;

testing means connected to said interface means and said media storage device so that when an read data input signal is received from said media storage device, said testing means can measure said read data input signal in various ways, wherein, said plurality of bits are set to a predetermined sequence;

said plurality of bits are read and compared to said predetermined sequence; and any of said plurality of bits, the level of which does not match the level of the corresponding bit in said predetermined sequence, is considered defective; and further wherein, said plurality of bits are set to a first level;

said plurality of bits are set to a second level;

said plurality of bits are read and compared to a predetermined threshold signal level; and any of said plurality of bits, the level of which exceeds said predetermined threshold signal level is considered defective.

17. A micro defects tester as in claim 16 wherein the control means further comprises:

buffer means for buffering signals received from said communication means; and decoding means connected to said plurality of buffers for decoding signals received from said plurality of buffers representing errors detected on said media whereby said detected error positions may be stored.

18. A micro defects tester as in claim 17 wherein said decoding means enable said buffer means whenever a valid decode signal is received from said communication means so that said control means may receive signals representing instructions for controlling said media storage device from said communication means or transmit signals representing media storage device status to said communication means.

19. A micro defects tester as in claim 18 wherein said control means includes an interface port, a plurality of input lines from said media storage device, and a plurality of output lines to said media storage device, and wherein said interface port monitors said plurality of input lines and outputs control signals on said plurality of output lines in response to signals from said communication means.

20. A micro defects tester as in claim 19 wherein said control means includes a programmable step pulse generator connected between said communication means and said interface port to provide said interface port with timed step pulses determined by said communication means so that timing can be set up to position said media storage device to one of said plurality of tracks.

21. A micro defects tester as in claim 16 wherein said interface means handle interface of data and control between said testing means and said communication means.

22. A micro defects tester as in claim 21 including a counter, wherein said interface means includes means for measuring time from index to each said detected error by controlling said counter to count up exactly one revolution to the detection of the next index, and recording means responsive to detection of said error to record the position of said error by storing the count of said counter from said index to said detected error for retrieval by said communication means.

23. A micro defects tester as in claim 22 wherein said interface means includes a memory device for storing said count from said counter for retrieval by said user through said communication means, whereby said user knows the location along said track which of said plurality of bits are defective in terms of bytes from index.

24. A micro defects tester as in claim 16 wherein said testing means further comprises write driver control means set to a desired write current level by said user which is then applied to said media storage device by said read/write means whereby said full write current and minimal write current are established.

25. A micro defects tester as in claim 24 wherein said testing means further includes comparing means comprising:
a threshold generator connected to said communication,
means which creates an extra pulse threshold signal, the level of which depends on and is defined to exceed the level of data normally received from said communication means.

26. A micro defects tester as in claim 25 wherein in the testing means comprises a comparator having first and second inputs and an output,
said threshold generator provides an extra pulse threshold signal to said first input;
the read data input signal is provides to said second input; and
said output is a first signal level if said extra pulse threshold exceeds said read data input signal and a second signal level if said read data input signal exceeds said extra pulse threshold.

27. A micro defects tester as in claim 26 wherein said testing means further includes missing pulse detecting means connected to said media storage device and said media storage device for receiving said read data input signal and detecting missing pulses.

28. A micro defects tester as in claim 27 wherein said testing means further includes selecting means for receiving said second signal level from said comparing means and for receiving a missing pulse signal from said missing pulse detecting means and for selecting which signal to send to said interference board.

29. A micro defects tester as in claim 28 wherein said testing means further comprises driving means connected to said selecting means, said comparing means, and said interface means, wherein:
said driving means receive said first signal level from said comparing means and then transmit said first signal level to said interface;
said driving means receive said second signal level from said selecting means and then transmit said second signal level to said interface means; and
said driving means receive said missing pulse signal from said selecting means and then transmit said missing pulse signal to said interface means.

30. A method of testing a media storage device including read/write means and having a plurality of bits, each bit having two possible levels, the method comprising the steps of
setting the plurality of bits to a first level by erasing at full write current in one direction or polarity;
setting the plurality of bits to a second level by erasing at minimal write current in a direction opposite to said one direction;
reading the plurality of bits and comparing the read signal to a predetermined threshold signal;
whereby any of the plurality of bits, the level of which exceeds the predetermined threshold signal level is considered defective.

31. A micro defects tester as claimed in claim 1 further including an external power supply connected to said media storage device and to said testing means to provide power for each device, and a test fixture comprising a mechanical assembly in order that said media storage device can be easily interfaced to said micro defects tester.

32. A micro defects tester as claimed in claim 16 further including an external power supply connected to said media storage device and to said testing means to provide power for each device, and a test fixture comprising a mechanical assembly in order that said media storage device can be easily interfaced to said micro defects tester.

* * * * *

UNITED STATES PATENT AND TRADEMARK OFFICE
CERTIFICATE OF CORRECTION

PATENT NO. : 4,949,036

DATED : August 14, 1990

INVENTOR(S) : David J. Bezinque, Mark R. McCormack, Michael E. Hammersley

It is certified that error appears in the above-identified patent and that said Letters Patent is hereby corrected as shown below:

Column 12, line 35, change "connect(r)d" to --connected--.

Signed and Sealed this

Twenty-second Day of September, 1992

*Attest:*

DOUGLAS B. COMER

*Attesting Officer*      *Acting Commissioner of Patents and Trademarks*